United States Patent
Liu et al.

(10) Patent No.: US 7,612,589 B2
(45) Date of Patent: Nov. 3, 2009

(54) PHASE-LOCKED LOOP AND CONTROL METHOD UTILIZING THE SAME

(75) Inventors: Chuan Liu, Hsinchu (TW); Chuan-Cheng Hsiao, Hsin-Chu (TW); Jeng-Horng Tsai, Kao-Hsiung (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 11/871,223

(22) Filed: Oct. 12, 2007

(65) Prior Publication Data
US 2009/0096496 A1 Apr. 16, 2009

(51) Int. Cl.
*H03L 7/06* (2006.01)
(52) U.S. Cl. .................... 327/156; 331/18; 375/376
(58) Field of Classification Search ......... 327/156–159; 331/18, 19, 25, 34, 1 A; 375/373–376
See application file for complete search history.

(56) References Cited
U.S. PATENT DOCUMENTS

| | | | |
|---|---|---|---|
| 5,347,232 A * | 9/1994 | Nishimichi | 331/1 A |
| 5,537,448 A * | 7/1996 | Schwarz et al. | 375/376 |
| 5,548,249 A | 8/1996 | Sumita et al. | |
| 5,623,234 A | 4/1997 | Shaik et al. | |
| 7,030,669 B2 * | 4/2006 | Hulfachor et al. | 327/156 |
| 2005/0097377 A1 | 5/2005 | Chou | |

* cited by examiner

*Primary Examiner*—Long Nguyen
*Assistant Examiner*—Shikha Goyal
(74) *Attorney, Agent, or Firm*—Thomas, Kayden, Horstemeyer & Risley

(57) ABSTRACT

A phase-locked loop includes a processing unit, a voltage-controlled oscillator, and a control unit. The processing unit generates a control voltage to a node according to a phase difference between a reference clock and a first feedback clock. The voltage-controlled oscillator generates the first feedback clock according to a voltage of the node. The control unit deactivates the voltage-controlled oscillator and provides a start voltage to the node in a power-down mode, and activates the voltage-controlled oscillator to generate the first feedback clock according to the voltage of the node in a power-on mode. The control unit stops providing the start voltage in the power-on mode.

21 Claims, 4 Drawing Sheets

PHASE-LOCKED LOOP AND CONTROL METHOD UTILIZING THE SAME

BACKGROUND OF THE INVENTION

1. Field of the Invention

The invention relates to a phase-locked loop, and more particularly to a phase-locked loop reducing power consumption.

2. Description of the Related Art

A phase-locked loop (PLL) is a circuit for maintaining phase and frequency of a clock generated by the PLL. The PLL is frequently utilized in a wireless communication system or an optical device. The clock is required when the data signal is decoded. The phase and the frequency of the clock determine whether the data signal is correctly decoded

BRIEF SUMMARY OF THE INVENTION

Phase-locked loops are provided. An exemplary embodiment of a phase-locked loop comprises a processing unit, a voltage-controlled oscillator, and a control unit. The processing unit generates a control voltage to a node according to a phase difference between a reference clock and a first feedback clock. The voltage-controlled oscillator generates the first feedback clock according to a voltage of the node. The control unit deactivates the voltage-controlled oscillator and provides a start voltage to the node in a power-down mode, and activates the voltage-controlled oscillator to generate the first feedback clock according to the voltage of the node in a power-on mode. The control unit stops providing the start voltage in the power-on mode.

Control methods are also provided. An exemplary embodiment of control method is described as follows. A processing unit is provided for generating a control voltage to a node according to a phase difference between a reference clock and a first feedback clock. A voltage-controlled oscillator is provided for generating the first feedback clock according to a voltage of the node. The voltage-controlled oscillator is deactivated and a start voltage is provided to the node in a power-down mode. The voltage-controlled oscillator is activated such that the voltage-controlled oscillator generates the first feedback clock according to the voltage of the node in a power-on mode. The voltage of the node is equal to the start voltage. The node stops receiving the start voltage in the power-on mode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
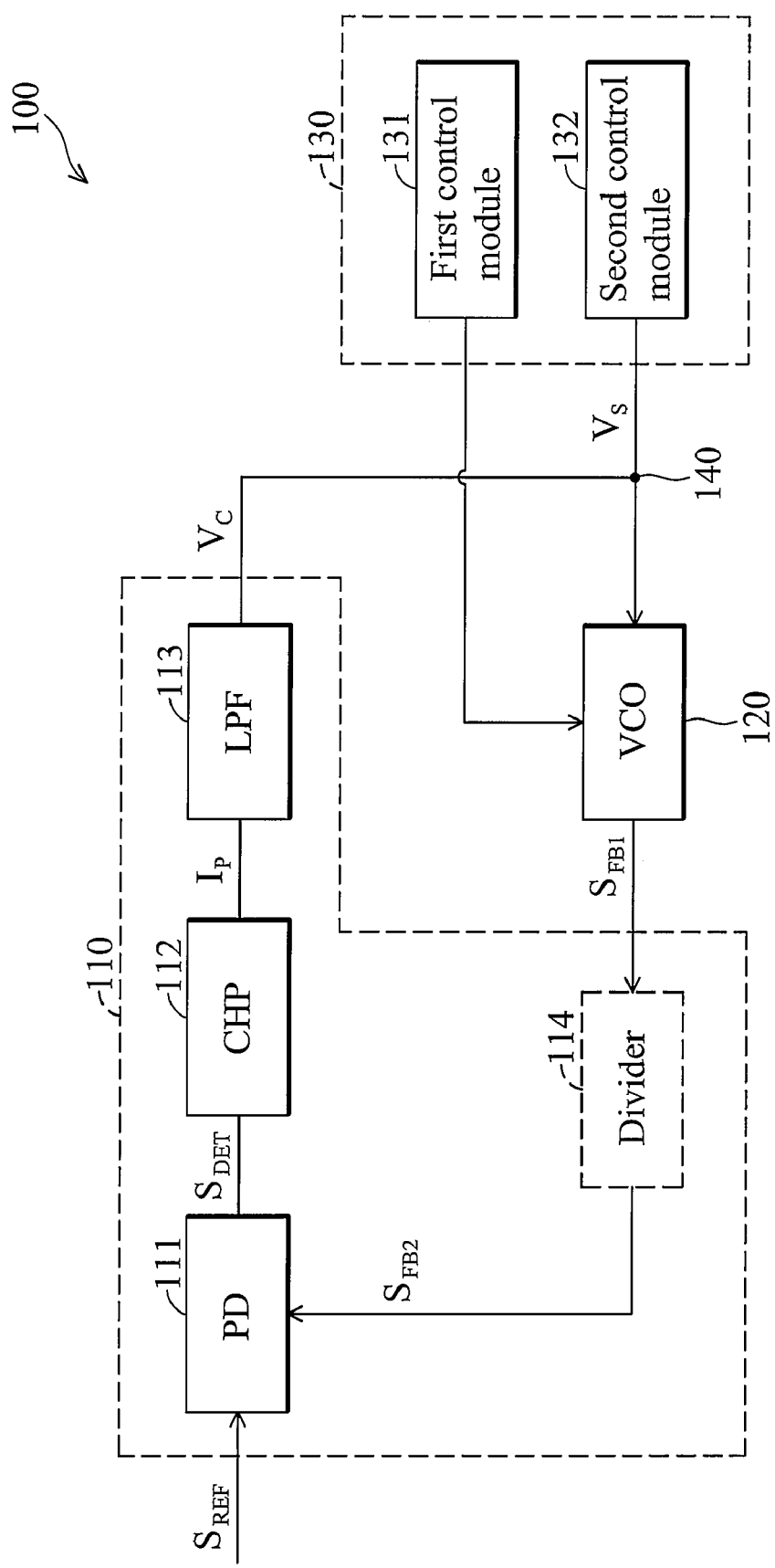
FIG. 1 is a schematic diagram of an exemplary embodiment of a phase-locked loop circuit.

FIG. 1 is a schematic diagram of an exemplary embodiment of a phase-locked loop circuit. Referring to FIG. 1 the phase-locked loop circuit (PLL) 100 comprises a processing unit 110, a voltage-controlled oscillator (VCO) 120, and a control unit 130. The processing unit 110 generates a control voltage $V_C$ to a node 140 according to a phase difference between a reference clock $S_{REF}$ and a first feedback clock $S_{FB1}$. The VCO 120 generates the first feedback clock $S_{FB1}$ according to the voltage of the node 140.

In a power-down mode, the control unit 130 deactivates the VCO 120 and provides a start voltage $V_S$ to the node 140. Since the VCO 120 is deactivated, the processing unit 110 stops normal operation (i.e. doesn't generate the control voltage $V_C$ which is originally wanted). In one embodiment, the node 140 is coupled to a capacitor (not shown) for storing the start voltage $V_S$ during the power-down mode.

During a transient from the power-down mode switched to a power-on mode, the start voltage $V_S$ stored in the capacitor activates the VCO 120 to actuate the processing unit 110. Therefore, the processing unit 110 starts to generate the control voltage $V_C$ to the node 140 in the transient.

In the power-on mode, the VCO 120 is activated by the control unit 130 and receives the control voltage $V_C$ from the node 140. Therefore, the first feedback clock $S_{FB1}$ is generated by the VCO 120 according to the control voltage $V_C$ of the node 140. Thus, the PLL 100 operates normally. When the PLL 100 operates normally, the processing unit 110 continues to generate the control voltage $V_C$ to the node 140, and the VCO 120 continues to receive the control voltage $V_C$ of the node 140 to generate the corresponding first feedback clock $S_{FB1}$ thereby.

During a transient from the power-on mode switched to the power-down mode, the control unit 130 starts to deactivate the VCO 120 and starts to provide a start voltage $V_S$ to the node 140. Therefore a clock generated by the VCO 120 is different from the first feedback clock $S_{FB1}$, and thereby the processing unit 110 stops normal operation.

In this embodiment, the processing unit 110 comprises a phase-frequency detector (PD) 111, a charge pump (CHP) 112, a low-pass filter (LPF) 113, and a divider 114. The divider 114 processes the first feedback clock $S_{FB1}$ to generate the second feedback clock $S_{FB2}$. Assuming the divide ratio of the divider 114 is two, frequency of the first feedback clock $S_{FB1}$ is double that of the second feedback clock $S_{FB2}$. After the frequency of the first feedback clock $S_{FB1}$ is divided (or multiplied), the PD 111 generates a detection signal $S_{DET}$ according to a phase difference between the reference clock $S_{REF}$ and the second feedback clock $S_{FB2}$. In some embodiments, the frequency of the first feedback clock $S_{FB1}$ is multiple to the frequency of the second feedback clock $S_{FB2}$. It should be noted that the divider 114 can be omitted, for example, when the frequency of the first feedback clock $S_{FB1}$ equals to the frequency of the reference clock $S_{REF}$.

The CHP 112 transforms the detection signal $S_{DET}$ into the pump current $I_P$. The LPF 113 transforms the pump current $I_P$ into the control voltage $V_C$ and provides the control voltage $V_C$ to the node 140. There is a capacitor to store the start voltage $V_S$ in the power-down mode. The capacitor can be implemented in the LPF 113 or in the control unit 130 (not shown).

Referring to FIG. 1, the control unit 130 comprises the first control module 131 and the second control module 132. In the power-down mode, the first control module 131 deactivates the VCO 120 and the second control module 132 provides the start voltage $V_S$ to the node 140. In the power-on mode, the first control module 131 activates the VCO 120 and the second control module 132 stops providing the start voltage $V_S$ to the node 140.

Figure 2:
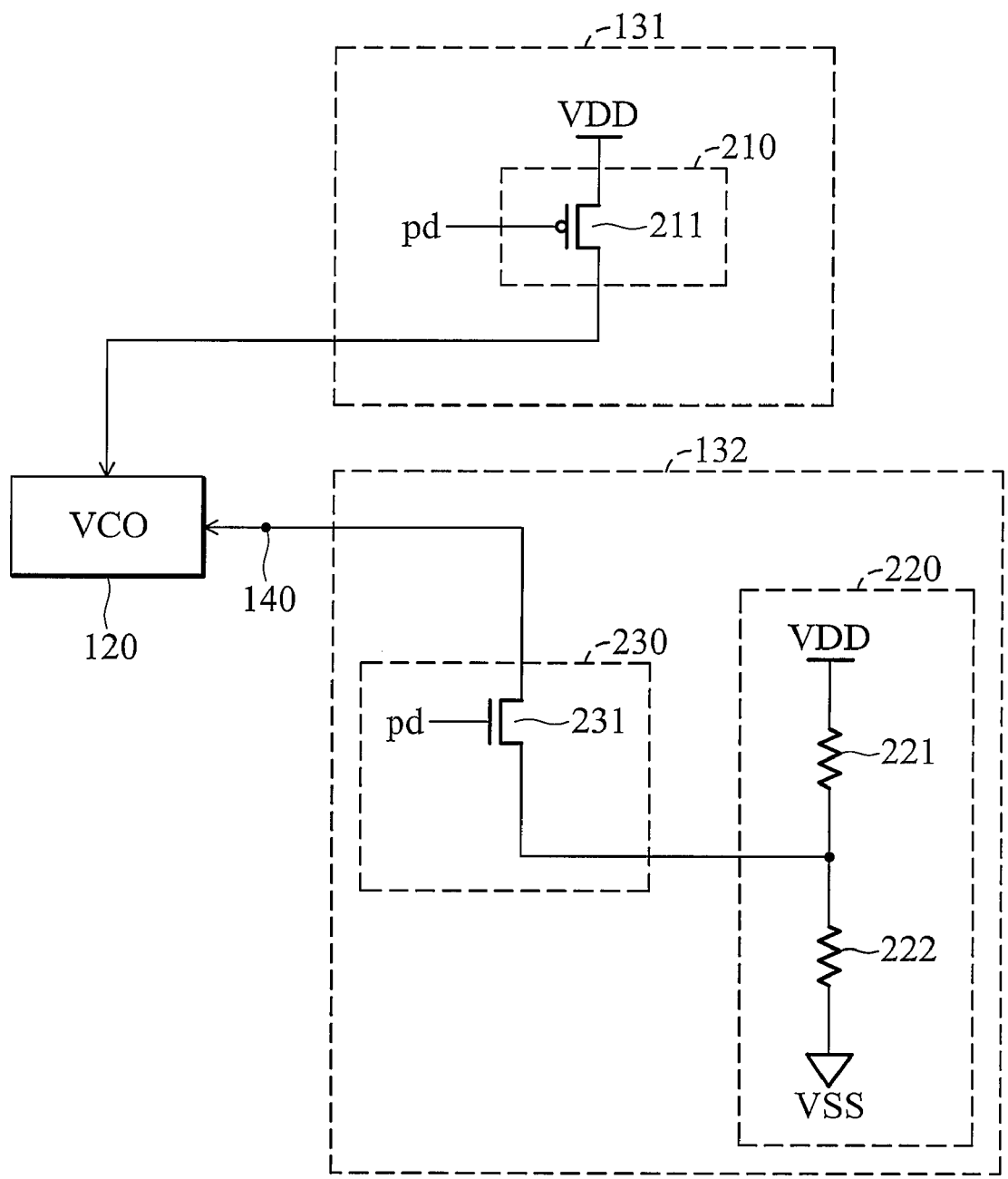
FIG. 2 is a schematic diagram of an exemplary embodiment of the control modules.

FIG. 2 is a schematic diagram of an exemplary embodiment of the first and the second control modules. Referring to FIG. 2, the first control module 131 comprises a first switch 210. In the power-down mode, the first switch 210 stops providing a voltage signal VDD to the VCO 120. In the power-on mode, the first switch 210 providing the voltage signal VDD to the VCO 120. In this embodiment, the first switch 210 is a P-type transistor 211. The level of a signal pd determines whether to turn on the transistor 211. The levels of signal pd in the power-on mode and power-down mode are opposing.

The control module 132 comprises a voltage divider 220 and a second switch 230. The voltage divider 220 generates the start voltage $V_S$. In the power-down mode, the second switch 230 transmits the start voltage $V_S$ to the node 140. In the power-on mode, the second switch 230 stops transmitting the start voltage $V_S$ to the node 140. In the embodiment, the voltage divider 220 comprises resistors 221 and 222. The resistors 221 and 222 are connected in series between voltage signal VDD and a grounding voltage VSS for generating the start voltage $V_S$. Additionally, the second switch 230 is an N-type transistor 231. The level of the signal pd determines whether to turn on transistor 231. In this embodiment, transistors 211 and 231 are controlled by the signal pd, thus, one transistor, such as the transistor 211, is the P-type transistor and another transistor, such as the transistor 231 is N-type transistor. When one transistor, such as the transistor 211, is turned off, another transistor, such as the transistor 231 is turned on. In another embodiment, transistors 211 and 231 can be implemented by transmission gates (not shown).

Referring to FIG. 1, assuming the signal pd is at a high level in the power-down mode. Since the transistor 211 is turned off, the VCO 120 cannot receive the voltage signal VDD. Thus, the VCO 120 does not generate the first feedback clock $S_{FB1}$ such that the PLL 100 stops operating normally. Since the signal pd is at the high level, the transistor 231 is turned on. Thus, the voltage of node 140 is equal to the start voltage $V_S$.

In the power-on mode, the signal pd is at a low level such that the transistor 211 is turned on. Thus, the VCO 120 receives the voltage signal VDD. At this time, the VCO 120 generates the first feedback clock $S_{FB1}$ according to the voltage of the node 140. The processing unit 110 generates the control voltage $V_C$ according to the phase difference between the reference clock $S_{REF}$ and the first feedback clock $S_{FB1}$. Then, the VCO 120 generates the first feedback clock $S_{FB1}$ according to the control voltage $V_C$. When the PLL 100 operates in the power-on mode after the power-down mode, the PLL 100 can quickly enter a locked state because the VCO 120 generates the appropriate first feedback clock $S_{FB1}$ according to the voltage of the node 140.

In some embodiments, the second control module 132 is a storage module which stores the control voltage $V_C$ in the power-on mode. In the power-down mode, the storage module (i.e. the second control module 132) provides the stored control voltage $V_C$ to the node 140. When the PLL 100 operates in the power-on mode after the power-down mode, the VCO 120 generates the appropriate first feedback clock $S_{FB1}$ according to the voltage of the node 140.

Generally, the reference clock $S_{REF}$ is generated by a crystal. Since the crystal consumes power, therefore the power consumption is reduced when the crystal is turned off in the power-down mode. In one embodiment, since the power consumption of a ring oscillator (OSC) is less than the power consumption of the crystal. Thus, a saving frequency is provided by a ring OSC to reduce the power consumption. The saving frequency is equal to or less than the frequency of the reference clock $S_{REF}$ generated by a crystal. In some embodiment, the saving frequency is equal to zero.

Figure 3:
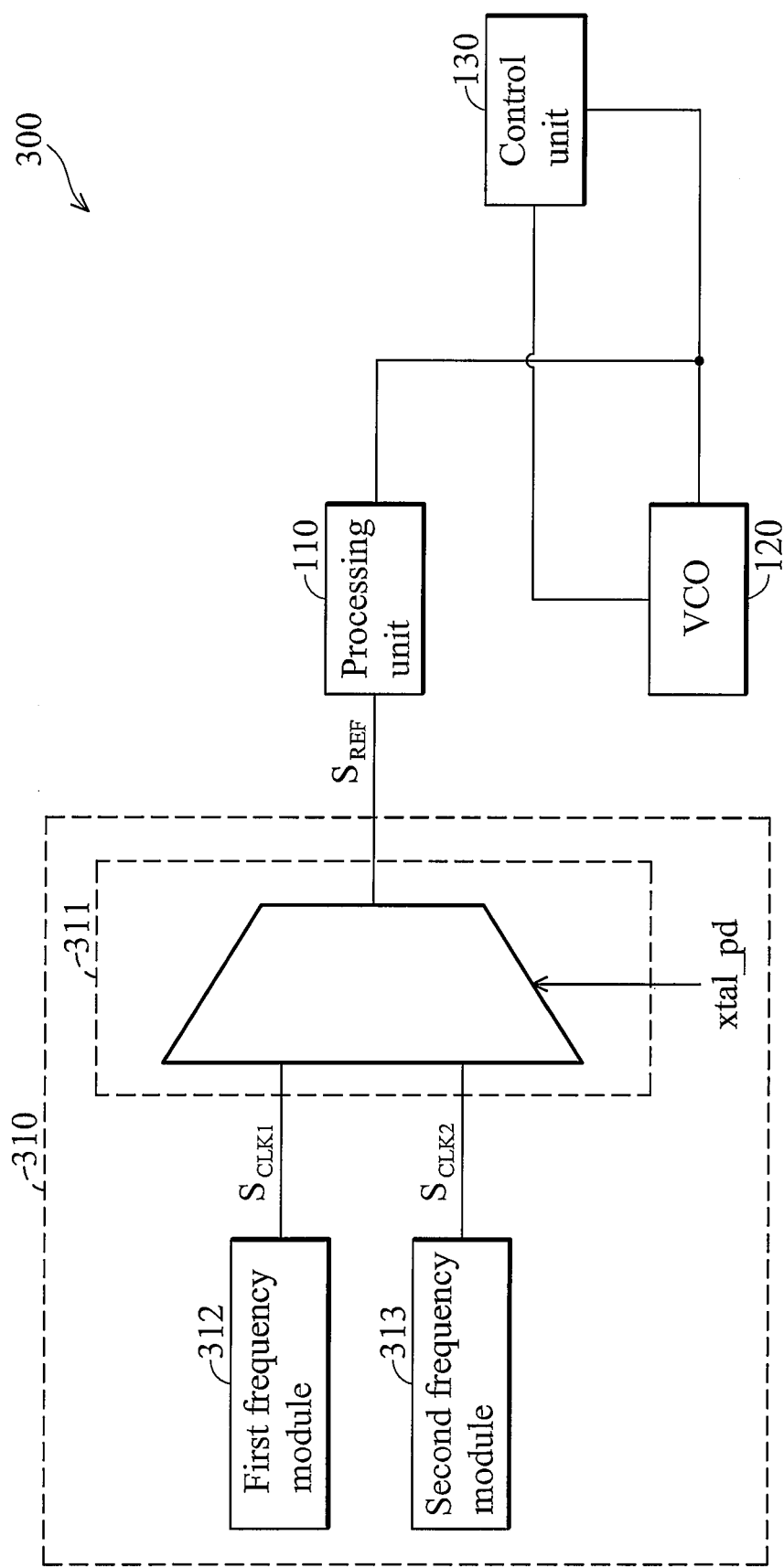
FIG. 3 is a schematic diagram of another exemplary embodiment of a phase-locked loop circuit.

FIG. 3 is a schematic diagram of another exemplary embodiment of a PLL. PLL 300 comprises a processing unit 110, a VCO 120, a control unit 130, and a frequency generating unit 310. The operations of the processing unit 110, the VCO 120, and the control unit 130 were previously described, as such descriptions are omitted for brevity. The frequency generating unit 310 controls the frequency of the reference clock $S_{REF}$. In the power-on mode, the processing unit 110 is required to operate normally such that the frequency of the reference clock $S_{REF}$ controlled by the frequency generating unit 310 is equal to a normal frequency. In the power-down mode, the processing unit 110 stops normal operation. Thus, the frequency of the reference clock $S_{REF}$ controlled by the frequency generating unit 310 is equal to a saving frequency less than or equal to the normal frequency.

In this embodiment, the frequency generating unit 310 comprises a selection module 311, and a first frequency module 312 and a second frequency module 313. The first frequency module 312 generates the first clock $S_{CLK1}$. The second frequency module 313 generates the second clock $S_{CLK2}$. The selection module 311 outputs the first clock $S_{CLK1}$ or the second clock $S_{CLK2}$ to the processing unit 110 according to a signal xtal_pd. The first clock $S_{CLK1}$ comprises the normal frequency that is required by the processing unit 110 in the power-on mode. The second clock $S_{CLK2}$ comprises the saving frequency that is required by the processing unit 110 in the power-down mode. The frequency of the second clock $S_{CLK2}$ is equal to or less than that of the first clock $S_{CLK1}$. When the frequency of the second clock $S_{CLK2}$ generated by the second frequency module 313 is equal to zero, the power consumption is further reduced. In this embodiment, the selection module 311 is a multiplexer and the second frequency module 313 is a ring OSC.

The processing unit requires a stable clock in the power-on mode and the stability of the crystal is better than that of the ring OSC. Thus, the processing unit receives a clock generated by the crystal in the power-on mode. For reducing power consumption, the crystal is turned off and the processing unit receives a clock generated by the ring OSC in the power-down mode. When the crystal operates in the power-on mode after the power-down mode, the crystal is turned on. The crystal requires a relatively longer time to provide the stable clock. Before the crystal is ready to provide the stable clock, the ring OSC is utilized to provide the stable clock to the processing unit. When the crystal is ready, the processing unit switches to receive the stable clock generated by the crystal.

Figure 4:
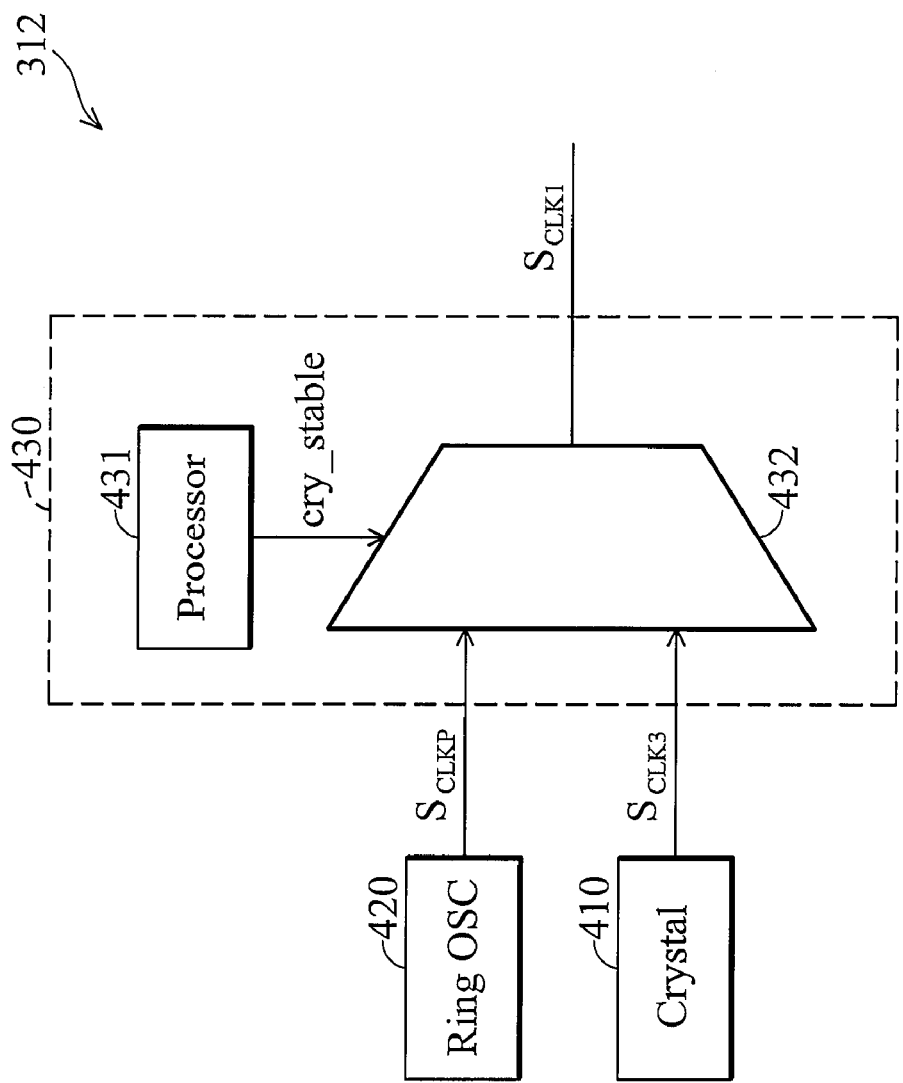
FIG. 4 is a schematic diagram of an exemplary embodiment of a frequency module.

FIG. 4 is a schematic diagram of another exemplary embodiment of the first frequency module 312. Referring to FIG. 4, the first frequency module 312 comprises a crystal 410, a ring OSC 420, and a processing module 430. The crystal 410 generates a third clock $S_{CLK3}$. The ring oscillator 420 generates a pseudo clock $S_{CLKP}$. The frequency of the pseudo clock $S_{CLKP}$ is equal to that of the third clock $S_{CLK3}$. The processing module 430 provides one of the third clock $S_{CLK3}$ and the pseudo clock $S_{CLKP}$ to serve as the first clock $S_{CLK1}$. In this embodiment, the crystal 410 stops generating the third clock $S_{CLK3}$ in the power-down mode.

The processing module 430 comprises a processor 431 and a selector 432. The processor 431 generates a control signal cry_stable. When the control signal cry_stable is at a first level (such as a high level or a low level), the selector 432 outputs the third clock $S_{CLK3}$ to serve as the first clock $S_{CLK1}$. When the control signal cry_stable is at a second level (such as a low level or a high level), the selector 432 outputs the pseudo clock $S_{CLKP}$ to serve as the first clock $S_{CLK1}$. In this embodiment, the selector 432 is a multiplexer.

In one embodiment, the processor 431 is a detector detecting the amplitude of the third clock $S_{CLK3}$. When the amplitude of the third clock $S_{CLK3}$ is equal to a preset value, the level of the control signal cry_stable controlled by the detector is at the first level. When the amplitude of the third clock $S_{CLK3}$ is less than the preset value, the level of the control signal cry_stable controlled by the detector is at the second level.

In another embodiment, the processor 431 is a counter. When the counter operates in the power-on mode after the power-down mode, the counter starts counting. When the counter counts to a preset value, the level of the control signal cry_stable controlled by the counter is at the first level. When the counter does not count to the preset value, the level of the control signal cry_stable controlled by the counter is at the second level.

In another embodiment, the processor 431 is a comparator for comparing the frequencies of the third clock $S_{CLK3}$ and the pseudo clock $S_{CLKP}$. When the frequency of the third clock $S_{CLK3}$ is approximate to the frequency of the pseudo clock $S_{CLKP}$, the level of the control signal cry_stable controlled by the comparator is at the first level. When the frequency of the third clock $S_{CLK3}$ is not approximate to the frequency of the pseudo clock $S_{CLKP}$, the level of control signal cry_stable controlled by the comparator is at the second level.

When the level of the control signal cry_stable is at the first level, the crystal 410 can generate the stable clock $S_{CLK3}$. Thus, the processing module 430 outputs the third clock $S_{CLK3}$ to be the first clock $S_{CLK1}$ for the selection module 311. When the level of control signal cry_stable is at the second level, the crystal 410 cannot generate the stable clock $S_{CLK3}$. Thus, the processing module 430 outputs the pseudo clock $S_{CLKP}$ to the selection module 311. At the moment that the crystal 410 starts to oscillate, the crystal 410 can not provide the stable clock $S_{CLK3}$. Therefore, the ring oscillator 420 generates the pseudo clock $S_{CLKP}$, which is approximate to the frequency of the third clock $S_{CLK3}$, can be served to be the first clock $S_{CLK1}$.

It should be noted that the control unit 130 can deactivates the VCO 120 by decrease the control voltage $V_C$ of the node 140, or just pull down the control voltage $V_C$ of the node 140 to be zero. In the later case of pulling down the control voltage $V_C$ to be zero, the saving frequency is zero.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A phase-locked loop, comprising:
    a processing unit generating a control voltage to a node according to a phase difference between a reference clock and a first feedback clock;
    a voltage-controlled oscillator generating the first feedback clock according to a voltage of the node; and
    a control unit deactivating the voltage-controlled oscillator and providing a start voltage to the node in a power-down mode, and activating the voltage-controlled oscillator to generate the first feedback clock according to the voltage of the node in a power-on mode, wherein the control unit stops providing the start voltage in the power-on mode.

2. The phase-locked loop as claimed in claim 1, wherein the control unit comprises:
    a first control module deactivating the voltage-controlled oscillator to stop providing the first feedback clock in the power-down mode and activating the voltage-controlled oscillator in the power-on mode; and
    a second control module providing the start voltage to the node in the power-down mode.

3. The phase-locked loop as claimed in claim 2, wherein the first control module comprises a first switch which stops providing a voltage signal to the voltage-controlled oscillator for deactivating the voltage-controlled oscillator in the power-down mode, and provides the voltage signal to the voltage-controlled oscillator for activating the voltage-controlled oscillator in the power-on mode.

4. The phase-locked loop as claimed in claim 3, wherein the second control module comprises:
    a voltage divider generating the start voltage; and
    a second switch transmitting the start voltage to the node in the power-down mode.

5. The phase-locked loop as claimed in claim 4, wherein one of the first and second switches is a P-type transistor and the other is an N-type transistor, or each of the first switch and the second switch is a transmission gate.

6. The phase-locked loop as claimed in claim 2, wherein the second control module comprises a storage module which stores the control voltage in the power-on mode and provides the stored control voltage to the node in the power-down mode.

7. The phase-locked loop as claimed in claim 1, further comprising a frequency generating unit controlling frequency of the reference clock.

8. The phase-locked loop as claimed in claim 7, wherein the frequency generating unit comprises:
    a selection module outputting a first clock comprising the normal frequency in the power-on mode and outputting a second clock comprising the saving frequency in the power-down mode;
    a first frequency module generating the first clock; and
    a second frequency module generating the second clock.

9. The phase-locked loop as claimed in claim 8, wherein the second frequency module is a ring oscillator.

10. The phase-locked loop as claimed in claim 8, wherein the first frequency module comprises:
    a crystal generating a third clock;
    a ring oscillator generating a pseudo clock; and
    a processing module coupled to the selection module for providing one of the third clock and the pseudo clock to serve as the first clock.

11. The phase-locked loop as claimed in claim 10, wherein the processing module comprises:
    a processor controlling a control signal; and
    a selector providing the third clock to serve as the first clock when level of the control signal is at a first level and providing the pseudo clock to serve as the first clock when the level of the control signal is at a second level.

12. The phase-locked loop as claimed in claim 11, wherein the processor is a detector controlling the level of the control signal at the first level when amplitude of the third clock is equal to a preset value, and controlling the level of the control signal at the second level when amplitude of the third clock is less than the preset value.

13. The phase-locked loop as claimed in claim 11, wherein the processor is a counter controlling the level of the control signal at the first level when the counter counts to a preset value, and controlling the level of the control signal at the second level when the counter does not count to the preset value.

14. The phase-locked loop as claimed in claim 11, wherein the processor is a comparator controlling the level of the control signal at the first level when frequency of the third clock is approximate to that of the pseudo clock and controlling the level of the control signal at the second level when frequency of the third clock is not approximate to that of the pseudo clock.

15. The phase-locked loop as claimed in claim 10, wherein the crystal stops generating the third clock in the power-down mode.

16. The phase-locked loop as claimed in claim 1, wherein the processing unit comprises:
   a phase-frequency detector generating a detection signal according to a phase difference between the reference clock and the first feedback clock;
   a charge pump transforming the detection signal into a pump current; and
   a low-pass filter transforming the pump current into the control voltage and providing the control voltage to the node.

17. The phase-locked loop as claimed in claim 1, wherein the processing unit comprises:
   a divider processing the first feedback clock to generate a second feedback clock;
   a phase-frequency detector generating a detection signal according to a phase difference between the reference clock and the second feedback clock;
   a charge pump transforming the detection signal into a pump current; and
   a low-pass filter transforming the pump current into the control voltage and providing the control voltage to the node.

18. The phase-locked loop as claimed in claim 17, wherein frequency of the first feedback clock is multiple to the frequency of the second feedback clock.

19. A control method, comprising:
   providing a processing unit for generating a control voltage to a node according to a phase difference between a reference clock and a first feedback clock;
   providing a voltage-controlled oscillator for generating the first feedback clock according to a voltage of the node;
   deactivating the voltage-controlled oscillator and providing a start voltage to the node in a power-down mode;
   activating the voltage-controlled oscillator such that the voltage-controlled oscillator generates the first feedback clock according to the voltage of the node in a power-on mode, wherein the voltage of the node is equal to the start voltage; and
   stopping providing the start voltage to the node in the power-on mode.

20. The control method as claimed in claim 19, wherein deactivating comprises removing an operation voltage from the voltage-controlled oscillator.

21. The control method as claimed in claim 19, further comprising reducing frequency of the reference clock in the power-down mode.

* * * * *